United States Patent
Taft et al.

(10) Patent No.: US 11,637,756 B2
(45) Date of Patent: Apr. 25, 2023

(54) METHODS AND SYSTEMS FOR EVALUATING DATA TRANSPORTABILITY IN DISTRIBUTION GRIDS

(71) Applicant: Battelle Memorial Institute, Richland, WA (US)

(72) Inventors: Jeffrey D. Taft, Washington, PA (US); Sinan G. Aksoy, Seattle, WA (US); Casey C. Neubauer, West Richland, WA (US); Scott A. Upton, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 56 days.

(21) Appl. No.: 17/339,806

(22) Filed: Jun. 4, 2021

(65) Prior Publication Data

US 2021/0392050 A1 Dec. 16, 2021

Related U.S. Application Data

(63) Continuation-in-part of application No. 16/900,727, filed on Jun. 12, 2020, now Pat. No. 11,313,889.

(51) Int. Cl.
*H04L 41/12* (2022.01)
*H04L 67/12* (2022.01)
(Continued)

(52) U.S. Cl.
CPC ............ *H04L 41/12* (2013.01); *G01R 31/086* (2013.01); *G01R 31/40* (2013.01); *H04L 67/12* (2013.01)

(58) Field of Classification Search
CPC ....... G01R 31/086; G01R 31/40; H04L 41/12; H04L 41/145; H04L 67/12;
(Continued)

(56) References Cited

U.S. PATENT DOCUMENTS

| | | | |
|---|---|---|---|
| 9,641,026 B2 | 5/2017 | Boardman et al. | |
| 9,881,033 B2 | 1/2018 | Boardman et al. | |
| 10,740,775 B2* | 8/2020 | Hammerstrom | G06Q 50/06 |
| 11,146,103 B1* | 10/2021 | Davies | H02J 3/383 |
| 2021/0389356 A1 | 12/2021 | Reiman et al. | |

OTHER PUBLICATIONS

"Lecture 9: Dijkstra's Shortest Path Algorithm", Retrieved at: https://mat.uab.cat/~alseda/MasterOpt/MyL09.pdf—on Mar. 19, 2021, 28 pages.

(Continued)

*Primary Examiner* — John H Le
(74) *Attorney, Agent, or Firm* — Colby Nipper PLLC

(57) ABSTRACT

This document describes systems and techniques for evaluating and improving distribution-grid data transportability. These systems and techniques allow engineers to quantify the data transportability of a communication system within or connected to a distribution grid, which represents an ability to transport in real-time telemetry from source locations (e.g., sensors in the distribution grid) to control mechanisms. Distribution engineers can use the sensor readings to perform grid analytics, control operating parameters, and operate protection systems. Distribution engineers can also use the transportability of the communication system to evaluate the observability of the distribution grid, which represents an ability to combine actual measurements and various types of computations (e.g., analytics, estimators, forecasters) from a system model. Distribution engineers can then generate a sensor allocation plan that indicates the number and location of sensors to maximize observability for a fixed sensor cost and/or minimize sensor cost for predetermined observability.

22 Claims, 10 Drawing Sheets

(51) Int. Cl.
*G01R 31/08* (2020.01)
*G01R 31/40* (2020.01)

(58) Field of Classification Search
CPC .... H02J 13/00002; Y04S 40/00; Y04S 40/18; Y04S 10/30; Y02E 60/00
USPC ...................................................... 702/188
See application file for complete search history.

(56) References Cited

OTHER PUBLICATIONS

Benzi, et al., "Total communicability as a centrality measure", Journal of Complex Networks, vol. 1, Issue 2, https://doi.org/10.1093/comnet/cnt007, Dec. 2013, pp. 124-149.

Slutsker, et al., "Network Observability Analysis Through Measurement Jacobian Matrix Reduction", IEEE Transactions on Power Systems, vol. PWRS-2, No. 2; Control Data Corporation, May 1987, 6 pages.

Taft, "Connectivity, Centrality, and Bottleneckedness: On Graph Theoretic Methods for Power System", Jan. 30, 2020, 27 pages.

Taft, et al., "Determining Distribution Grid Stage Coverage Computationally", Grid; Modernization Laboratory Consortium; U.S. Department of Energy; PNNL-29338, Nov. 2019, 14 pages.

Taft, et al., "Extended Grid State Definition Document", Grid; Modernization Laboratory Consortium; U.S. Department of Energy; vol. 3.3, Feb. 2019, 35 pages.

Taft, et al., "Sensing and Measurement for Advanced Power Grids", Cisco Systems and Caltech Resnick Institute; Version 1.3, Oct. 22, 2012, 34 pages.

"Notice of Allowance", U.S. Appl. No. 16/900,727, filed Feb. 11, 2022, 13 pages.

* cited by examiner

1000 ⤵

```
┌─────────────────────────────────────────────────┐
│   Convert a netlist to an undirected graph      │
│                    1002                         │
└─────────────────────────────────────────────────┘
                        │
                        ▼
┌─────────────────────────────────────────────────┐
│   Determine, based on the undirected graph,     │
│   a structure sub-index for a communication system │
│                    1004                         │
└─────────────────────────────────────────────────┘
                        │
                        ▼
┌─────────────────────────────────────────────────┐
│   Determine, based on the undirected graph, a latency │
│   sub-index for the communication system        │
│                    1006                         │
└─────────────────────────────────────────────────┘
                        │
                        ▼
┌ ─ ─ ─ ─ ─ ─ ─ ─ ─ ─ ─ ─ ─ ─ ─ ─ ─ ─ ─ ─ ─ ─ ─ ─ ┐
   Determine a packet-loss sub-index for the communication system
│                    1008                         │
└ ─ ─ ─ ─ ─ ─ ─ ─ ─ ─ ─ ─ ─ ─ ─ ─ ─ ─ ─ ─ ─ ─ ─ ─ ┘
                        │
                        ▼
┌─────────────────────────────────────────────────┐
│   Determine, using the structure sub-index, latency sub-index, and/or │
│   packet-loss sub-index, a data transportability of a distribution grid │
│                    1010                         │
└─────────────────────────────────────────────────┘
                        │
                        ▼
┌─────────────────────────────────────────────────┐
│   Generate a sensor allocation plan for the distribution grid │
│                    1012                         │
└─────────────────────────────────────────────────┘
```

*FIG. 10*

METHODS AND SYSTEMS FOR EVALUATING DATA TRANSPORTABILITY IN DISTRIBUTION GRIDS

STATEMENT AS TO RIGHTS TO DISCLOSURES MADE UNDER FEDERALLY-SPONSORED RESEARCH AND DEVELOPMENT

This disclosure was made with Government support under Contract DE-AC0576RL01830 awarded by the U.S. Department of Energy. The Government has certain rights in the invention.

BACKGROUND

The integration of distributed energy resources in electrical grids is rapidly increasing. Distributed energy resources can include rooftop photovoltaic inverters, megawatt-level photovoltaic farm inverters, smart thermostats, solar panels, and energy storage devices. For example, electric companies are installing more and more solar-power-producing devices and wind turbines to meet increased demand. Reductions in the cost of distributed energy resources, higher electricity prices, tighter environmental-impact regulations, and heightened sustainability concerns drive this increased demand. Integrating distributed energy resources into legacy power systems is changing the operational dynamics of distribution grids. Distribution grids in the recent past did not require much instrumentation or many sensors to manage and operate. The increased prevalence of distributed energy resources has created new problems for distribution engineers in monitoring, managing, and controlling power flows in electrical grids, especially distribution grids.

Increased monitoring and observability of the operation and performance characteristics of distribution grids is needed to solve these power-management problems. The need for increased observability also requires improved instrumentation. Increased monitoring and improved instrumentation also require more real-time data from the distribution grid to monitor and control the power flows. Distribution engineers are increasingly responsible for developing sensor allocation plans that can, for example, identify how many sensors to add to a distribution grid, the types of sensors to add, and the location of the new sensors in the distribution grid. Distribution engineers are also responsible for analyzing the suitability of communication systems connected to the distribution grid. While tools exist for managing the operation of balanced, three-phase transmission systems, design tools are not available to solve these sensor-allocation problems for distribution grids or to assess the suitability of communication systems. For example, the existing tools generally do not account for the unbalanced phases, topological complexities, or uncertainty associated with distribution grids. There is also a lack of systems and techniques to assess the instrumentation of a distribution grid quantitatively and the communication system connected to it to monitor and control the distribution grid.

SUMMARY

This document describes systems and techniques for evaluating and improving distribution-grid data transportability. These systems and techniques allow distribution engineers to quantify the data transportability of a communication system within or connected to a distribution grid, which represents an ability to transport in real-time telemetry from source locations (e.g., sensors in the distribution grid) to control mechanisms. Distribution engineers can use the sensor readings to perform grid analytics, control operating parameters (e.g., voltages, currents, and power flows of the distribution grid), and operate protection systems. Distribution engineers can also use the transportability of the communication system to evaluate observability, which represents an ability to combine actual measurements and various types of computations (e.g., analytics, estimators, forecasters) from a system model. Distribution engineers can then generate a sensor allocation plan that indicates the number and location of sensors to maximize observability for a fixed sensor cost and/or minimize sensor cost for a predetermined system or model observability.

In some aspects, this document describes a method for evaluating and improving distribution-grid data transportability. The method includes converting a netlist to an undirected graph. The netlist represents one or more vertices and edges of a communication system within or connected to the distribution grid. The method uses the undirected graph to determine a structure sub-index and a latency sub-index for the communication system. The structure sub-index provides an indicator of the usefulness of a proposed network structure or topology in communicating data from the distribution grid. The latency sub-index provides an indicator of the effect of a change in a preferred path (e.g., a link or node failure) on delays in communicating data from the distribution grid. The method then determines, using the product of the structure sub-index and the latency sub-index, the data transportability of the distribution grid. Using the transportability of the communication system, distribution engineers can generate a sensor allocation plan for the distribution grid.

This document also describes other configurations of, and systems for, evaluating and improving distribution-grid data transportability, as well as non-transitory computer-readable storage media to perform the above method and other methods described herein.

This Summary is provided to introduce simplified concepts for evaluating and improving distribution-grid data transportability, which is further described below in the Detailed Description and Drawings. This Summary is not intended to identify essential features of the claimed subject matter, nor is it intended for use in determining the scope of the claimed subject matter.

BRIEF DESCRIPTION OF THE DRAWINGS

The details of one or more aspects for evaluating and improving distribution-grid observability and transportability are described in this document with reference to the following drawings. The same numbers are used throughout multiple drawings to reference like features and components:

FIG. 10 illustrates an example method for determining data transportability of a communication system within or connected to a distribution grid.

DETAILED DESCRIPTION

Overview

Figure 1:
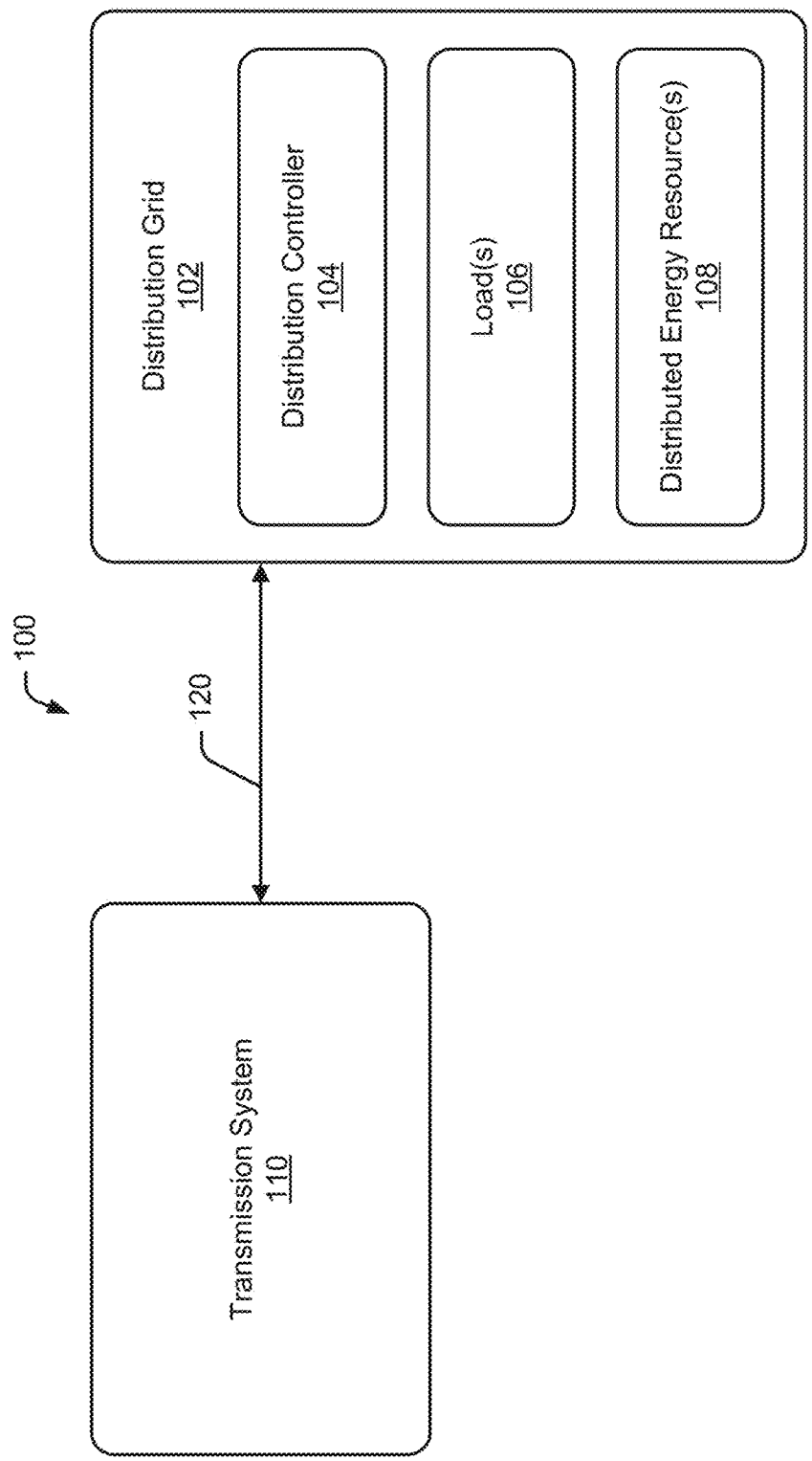
FIG. 1 is a schematic illustration of a system including a transmission system and a distribution grid.

As distribution grids have become more complex, engineers have developed a definition of the grid state to assist in managing these systems. This definition allows system engineers and operators to relate sensor measurements (e.g., voltages, currents, power flows, and phase angles) to the grid state and determine the operating status of a distribution grid. Because it is generally not practical to use a large number of sensors, an issue for managing distribution grids is determining how much sensor data is necessary and from where to collect it. Engineers have developed definitions of visibility, data transportability, and observability to quantify the grid state of distribution grids.

Data transportability is the ability to transfer data from sensors to points of use. In other words, it quantifies the capabilities of the communication systems within and connected to distribution grids to deliver measurement data to distribution systems (e.g., Distribution Management System (DMS)) and/or distribution applications. In some distribution grids, the data transportability is less than ideal (e.g., less than an index value of 1.0) because it can be challenging to move measurement data from remote grid locations to points of use.

Visibility is the capability of a distribution system to obtain usable direct measurements of grid parameters. It generally involves two functions: taking sensor measurements at points in the distribution grid and transporting the measurement data to usage points.

Observability assesses the ability to combine, using a system model, actual measurements in the distribution grid with system models and various types of computations (e.g., analytics, estimators, forecasters) to generate actionable estimated measurements. Observability introduces the concept of estimating grid-state information to supplement visibility. The estimated measurements may include grid-state information that may not have been directly sensed and may include processing to extract from actual measurements. In other words, the observability of a distribution grid is the ability to estimate a set of operating parameters (e.g., voltages, currents, current flow, power flows) from sensor readings. This definition allows system engineers and operators to evaluate how completely grid-state parameters can be determined.

As described above, distribution engineers generally do not have design tools to assist with sensor allocation in distribution grids. In particular, distribution engineers lack systems and techniques to assess the instrumentation in terms of data transportability, visibility, and observability. The high nodal volume, lack of useful metadata, and unknowns or imprecisely-known data points (e.g., grid topology, availability of behind-the-meter distributed energy resources) make it challenging to apply conventional transmission-grid tools to distribution grids. Many distribution engineers have integrated additional sensors into distribution grids to address the increasing complexity of distribution grids and grid-state management. The new measurement data does not necessarily significantly improve grid transportability, visibility, and observability.

This document describes systems and techniques to quantify observability from a set of sensor measurements, which can be sparse in distribution grids. Distribution engineers can use observability determinations to determine "islands of observability" in a distribution grid. Islands of observability represent regions where operating parameters and state values can be either measured or estimated. For example, with sufficient measured bus voltages, grid planning tools or grid management systems can determine other potential state values within the island of observability. By exclusion, islands of observability define portions of the distribution grid where it is not possible to make such determinations. Distribution engineers can use these regions to identify observability deficiencies that require additional sensor measurements for proper grid operation.

This document also describes systems and techniques to quantify data transportability from a communication system netlist, including a list of vertices and edges of a communication system within and connected to the distribution grid. A process flow can convert the netlist into an undirected graph. Using the undirected graph, the process flow can then determine a structure sub-index and a latency sub-index for the communication system. The process flow can use the structure sub-index and the latency sub-index to determine the data transportability. In this way, distribution engineers can make use of elements of graph theory to consider possible uses of the communication system rigorously and simultaneously without the need to enumerate specific use case and perform simulations.

The described systems and techniques can make use of relationships between sensors and grid parameters to increase observability. The systems and techniques can establish these relationships considering sensors and their placement in a system model. The accuracy of the system model and the effectiveness of the communication system can be taken into account to determine zones where full observability is possible (e.g., islands of observability) and where, by exclusion, it is not. Distribution engineers can place sensors within the system model to automatedly recalculate the observability of the distribution grid. In this way, the described systems and techniques enable distribution engineers to allocate sensors in a distribution grid according to sensor-allocation strategies and to optimize sensor placement. For example, a distribution engineer can maximize observability for a fixed sensor cost and/or minimizes sensor cost for a target or predetermined system or model observability by placing sensors within the actual distribution grid.

Operating Environment

FIG. 1 is a schematic view that illustrates a system 100 including a distribution grid 102 and a transmission system 110. As shown in FIG. 1, the transmission system 110 is connected to the distribution grid 102 via a connection 120 (e.g., overhead and underground transmission power lines). The distribution grid 102 can include a distribution controller 104 for controlling operations of the distribution grid 102, loads 106, and distributed energy resources 108.

The distribution controller 104 can be implemented as one or more processors or computing devices configured to execute operations associated with power management and distribution within the distribution grid 102. The distribution controller 104 can constitute respective modules that execute operations within a computing environment to provide power management and distribution services within the distribution grid 102. The distribution controller 104 can also include memory or other non-transitory computer-readable storage media encoded with instructions (e.g., computer-executable instructions) that, when executed by the one or more processors, perform power-management and distribution services.

The loads 106 represent commercial or residential distribution points within the distribution grid 102 for receiving adjusted electrical power from the transmission system 110. Examples of the loads 106 include residences, businesses, industrial consumers, government entities, and other consumers that rely on the distribution grid 102 for power.

The distributed energy resources 108 represent distribution feeders to the distribution grid 102. The distribution grid 102 can use the additional capacity provided by the distributed energy resources 108 to supplement adjusted power received from the transmission system 110 to power the loads 106. While primarily described as photovoltaic-type distributed energy resources (e.g., rooftop photovoltaic inverters, megawatt-level photovoltaic farm inverters), other examples of the distributed energy resources 108 exist. As some examples, the distributed energy resources 108 can include geothermal, hydroelectric, wind-based inverter units, and energy storage devices configured to provide electrical capacity to the distribution grid 102.

In operation, the transmission system 110 delivers electrical power to the distribution grid 102 via the connection 120. The transmission system 110 adjusts (e.g., step-downs, step-ups, frequency shifts, phase shifts) the electrical power for consumption by the distribution grid 102. The distribution controller 104 controls the distribution grid 102 to distribute the adjusted electrical power to the loads 106. The distributed energy resources 108 can inject additional electrical capacity into the distribution grid 102 to assist in powering the loads 106. The distribution controller 104 can control the distributed energy resources 108 to assist in powering the loads 106 given the adjusted electrical power.

Figure 2:
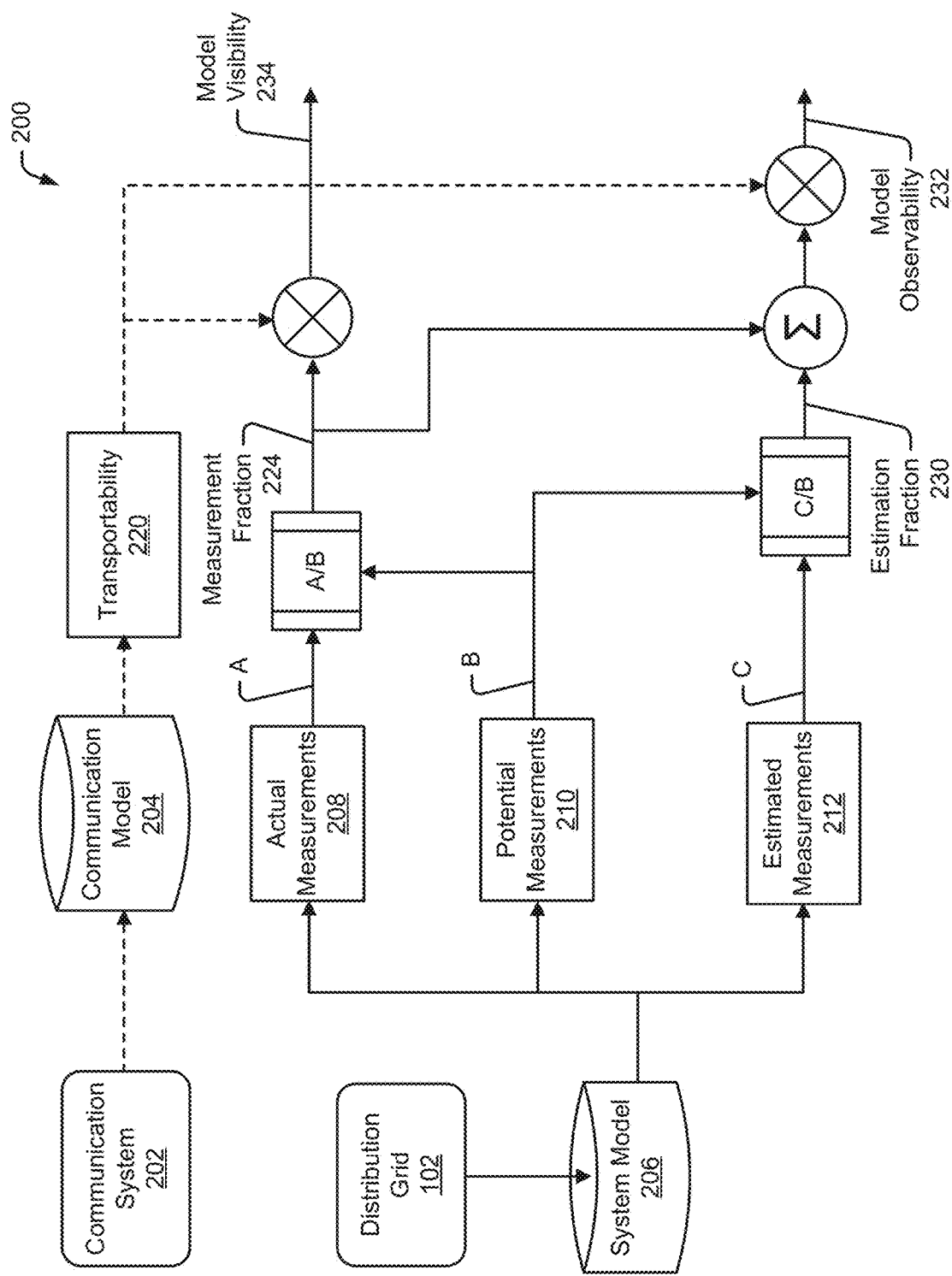
FIG. 2 is a high-level flow chart of a grid planning tool to evaluate and improve a model visibility and a model observability of a system model.

FIG. 2 illustrates a high-level flow chart of a grid planning tool 200 to evaluate and improve a model visibility 234 and a model observability 232 of a system model 206. The system model 206 provides a topological representation of the distribution grid 102. The system model 206 can represent all or a portion of the distribution grid 102.

The grid planning tool 200 begins with a communication model 204 and the system model 206. The communication model 204 provides information about a communication system 202 within and connected to the distribution grid 102. In some implementations, distribution engineers can omit the communication model 204 and estimate the efficacy of the communication system 202 within and connected to the distribution grid 102. The system model 206 includes a representation of circuits, nodes, buses, sensors, and sensor locations within the distribution grid 102.

Distribution engineers can use the grid planning tool 200 to generate several indices (e.g., scores in the range of 0.0 to 1.0) to evaluate the transportability, visibility, and observability of the distribution grid 102. The grid planning tool 200 can be implemented using hardware, software, firmware, or a combination thereof. As an example, a computer system performs the operations of the grid planning tool 200. The computer system can include one or more processors and computer-readable storage media. Applications and an operating system implemented as computer-readable instructions on the computer-readable storage media can be executed by the one or more processors to provide some or all of the functions described in this document. For example, the computer-readable storage media can include the communication model 204 and the system model 206. The communication model 204 and/or the system model 206 can be loaded from another computer system or another application. Distribution engineers can also generate the communication model 204 and/or the system model 206 on the same computer system that implements the grid planning tool 200.

To analyze the model observability 232, sensor types, sensor locations, and system connectivity are input to the grid planning tool 200 as part of the system model 206. This information can be provided by an advanced distribution management system (ADMS) platform or by a combination of utility planning and operations databases. As an example, distribution engineers can operate the grid planning tool 200 in an application for GridAPPS-D7, which is a standards-based ADMS application development platform.

The grid planning tool 200 generates the model visibility 234 and the model observability 232. The model visibility 234 quantifies the direct visibility that sensors provide within the system model 206. The model observability 232 quantifies the observability that the sensors offer within the system model 206.

The grid planning tool 200 determines several intermediate values to generate the model visibility 234 and the model observability 232. These values include a transportability 220, a measurement fraction 224, and an estimation fraction 230.

The transportability 220 generally accounts for communication limitations in the communication system 202. It provides an approximate quantification of the communication system 202 within and connected to the distribution grid 102 without requiring specific identification of deficiencies therein. For example, the transportability 220 takes into account network path redundancy and performance parameters (e.g., channel throughput, latency, packet loss) of the communication system 202. Distribution engineers familiar with the communication system 202 can generally identify this information to analyze the communication model 204 and determine the transportability 220.

The measurement fraction 224 provides a ratio of actual measurements 208 to potential measurements 210. The grid planning tool 200 identifies the sensor types and sensor locations, which the grid planning tool 200 can identify in terms of equipment, circuits, nodes, and/or buses within the system model 206. The grid planning tool 200 uses the sensor information to determine the number of actual measurements 208.

The potential measurements 210 represent the total possible, non-redundant measurements in the system model 206. In other words, the potential measurements 210 indicate the number of state elements that define the grid state of the distribution grid 102. The grid planning tool 200 determines the measurement fraction 224 by dividing the actual measurements 208 by the potential measurements 210. The grid planning tool 200 then determines the model visibility 234 of the system model 206 by multiplying the measurement fraction 224 by the transportability 220.

The estimation fraction 230 is the quotient of estimated measurements 212, which are unmeasured state elements that the grid planning tool 200 can calculate from measurement data, and the potential measurements 210. The grid planning tool 200 determines the estimated measurements 212 using a symbolic algebra process (e.g., a symbolic Jacobian) in the system model 206. The symbolic Jacobian is a binary matrix that maps measurements to their adjacent buses. In mathematical terms, it describes the set of bus voltages that would be required to calculate the value of a particular state element.

The grid planning tool 200 generally uses two sets of data to construct the symbolic Jacobian. The first set is system connectivity data. The system connectivity data can come from a network admittance matrix and/or a network connectivity database. If a multi-phase admittance matrix is used, the grid planning tool 200 can extract bus-to-bus connectivity. The grid planning tool 200, however, can perform the described systems and techniques using connectivity alone. In other implementations, the grid planning tool 200 uses the admittance parameter(s) of each connection to estimate states of the system model 206. The second set of data used by the grid planning tool 200 is sensor types and locations. The grid planning tool 200 uses this information to determine how completely grid-state information of the distribution grid 102 can be determined.

The grid planning tool 200 can also use the symbolic algebra to group the actual measurements 208 and the estimated measurements 212 into islands of observability. Islands of observability include a set of point measurements (e.g., voltages) that can be measured or estimated, which in turn determine other potential measurements 210. The symbolic algebra avoids the need for extensive simulations and efficiently determines the potential measurements 210, even for large distribution grids.

Once it has constructed the symbolic Jacobian, the grid planning tool 200 can use symbolic algebraic substitution to determine which unknown point measurements can be calculated from the actual measurements 208. The grid planning tool 200 can identify potential point measurements using substitution based on flow measurement equations. For example, if the voltage at one endpoint of a flow-sensor measurement is known, the voltage at the other endpoint can be estimated. Similarly, the grid planning tool 200 can identify current or power values at a node using substitution based on single-adjacent-bus injection measurement. As an example, current or power injected into a bus with only one adjacent bus (or one adjacent bus with an unknown flow value) can be treated as flowing from the injection bus to the adjacent bus. The grid planning tool 200 can also identify bus voltages using simplification based on multiple adjacent-bus injections measurements. For example, sets of adjacent bus injections can be analyzed for solvable subsystems including the same number of measurement equations as unknown bus voltages.

Once it has performed the symbolic algebra, the grid planning tool 200 can determine the estimated measurements 212. The estimated measurements 212 can include point measurements (e.g., bus voltage) if the associated bus is a member of an island of observability; flow measurements (e.g., bus current, bus power) if the buses on the ends are members of any island of observability; or injection measurements (e.g., power, current) if the adjacent buses are members of any island of observability. The grid planning tool 200 calculates the estimation fraction 230 by dividing the estimated measurements 212 by the potential measurements 210. The grid planning tool 200 then determines the model observability 232 by multiplying the estimation fraction 230 by the transportability 220.

The grid planning tool 200 quantifies the observability of the distribution grid 102 by calculating the model visibility 234 and the model observability 232. Using the islands of observability, the grid planning tool 200 and/or distribution engineers can also identify the regions of the distribution grid 102 wherein the observability is deficient. Distribution engineers, using the grid planning tool 200, can incrementally change the sensor allocation of the system model 206 to observe changes in the model observability 232. The grid planning tool 200 can implement an optimization engine or pre-programmed sensor allocation strategies to automate the process of identifying an ideal sensor-allocation plan. In particular, distribution engineers can use the grid planning tool 200 to maximize the model observability 232 for a fixed sensor cost or minimize sensor cost for a target or predetermined system or model observability. Using the generated sensor-allocation plan, distribution engineers can add, install, or otherwise include sensors within the distribution grid 102 to achieve the desired observability.

Figure 3:
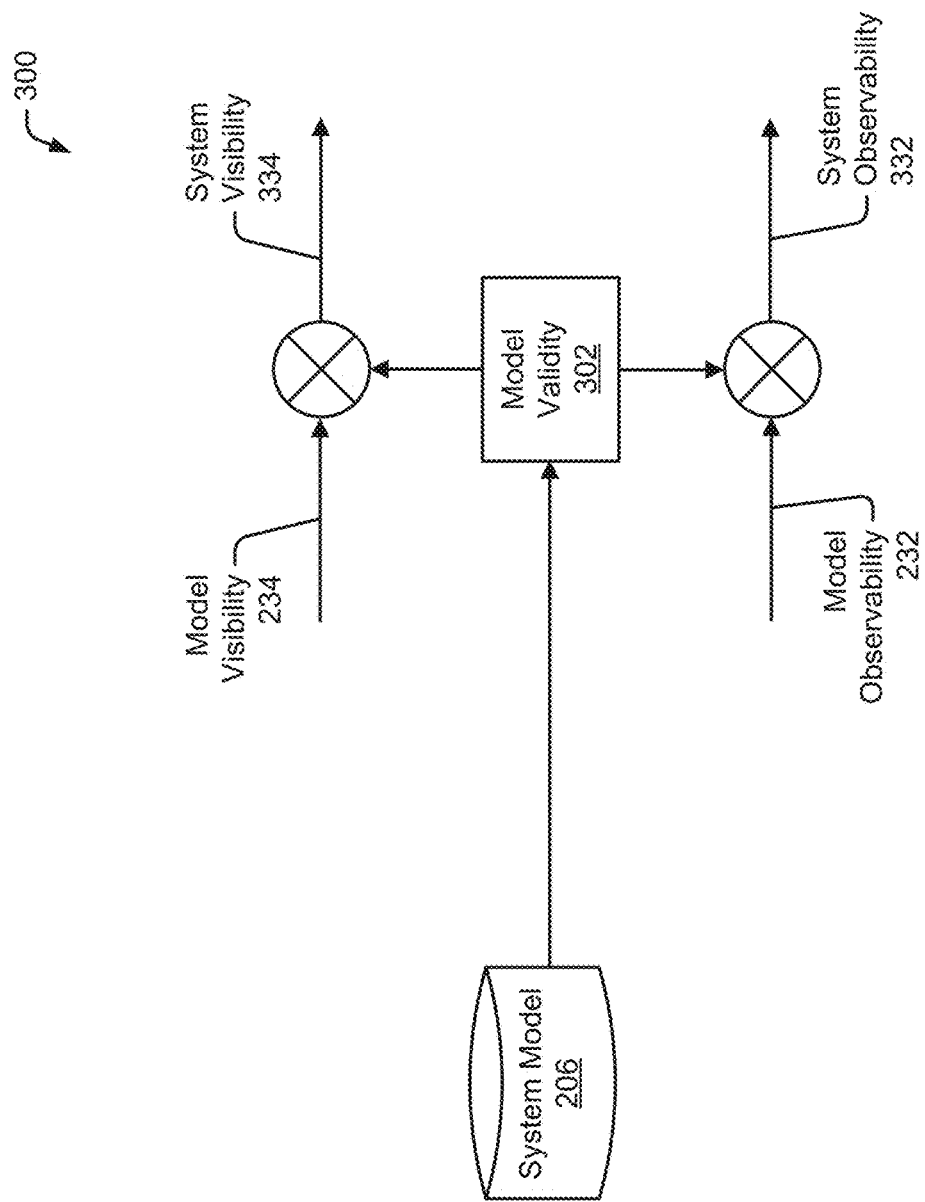
FIG. 3 is a high-level flow chart of a grid planning tool to evaluate and improve a system visibility and a system observability of a distribution grid.

FIG. 3 illustrates a high-level flow chart of a grid planning tool 300 to generate and evaluate a system visibility 334 and a system observability 332 of the distribution grid 102. The grid planning tool 300, which can be the grid planning tool 200 of FIG. 2, provides distribution engineers an estimate of the accuracy of the system model 206 using a model validity 302. The system visibility 334 quantifies the visibility that the sensors provide within the distribution grid 102. The system observability 332 quantifies the observability that the sensors provide within the distribution grid 102.

The model visibility 234 and the model observability 232 assume the system model 206 provides a perfect representation of the distribution grid 102 (e.g., an index value of 1.0). The model validity 302 accounts for inaccuracies in the system model 206 without requiring distribution engineers to identify and detail these inaccuracies specifically. The model validity 302 can be obtained from or generated by distribution engineers for the distribution grid 102. Distribution engineers can usually characterize an approximate value of the model validity 302 for a respective distribution grid 102. As an example, the model validity 302 generally falls within the 0.6 to 0.8 range for distribution grids. In this manner, the model validity 302 provides an approximate but relatively accurate representation of deficiencies in the system model 206.

The model validity 302 modifies the model visibility 234 and the model observability 232 to generate the system visibility 334 and the system observability 332. In particular, the grid planning tool 300 multiplies the model visibility 234 by the model validity 302 to calculate the system visibility 334. Similarly, the grid planning tool 300 multiplies the model observability 232 by the model validity 302 to determine the system observability 332. Although the model validity 302 does not provide an exact value for the system visibility 334 and the system observability 332, it offers sufficient granularity to generate a sensor-allocation plan.

Figure 4:
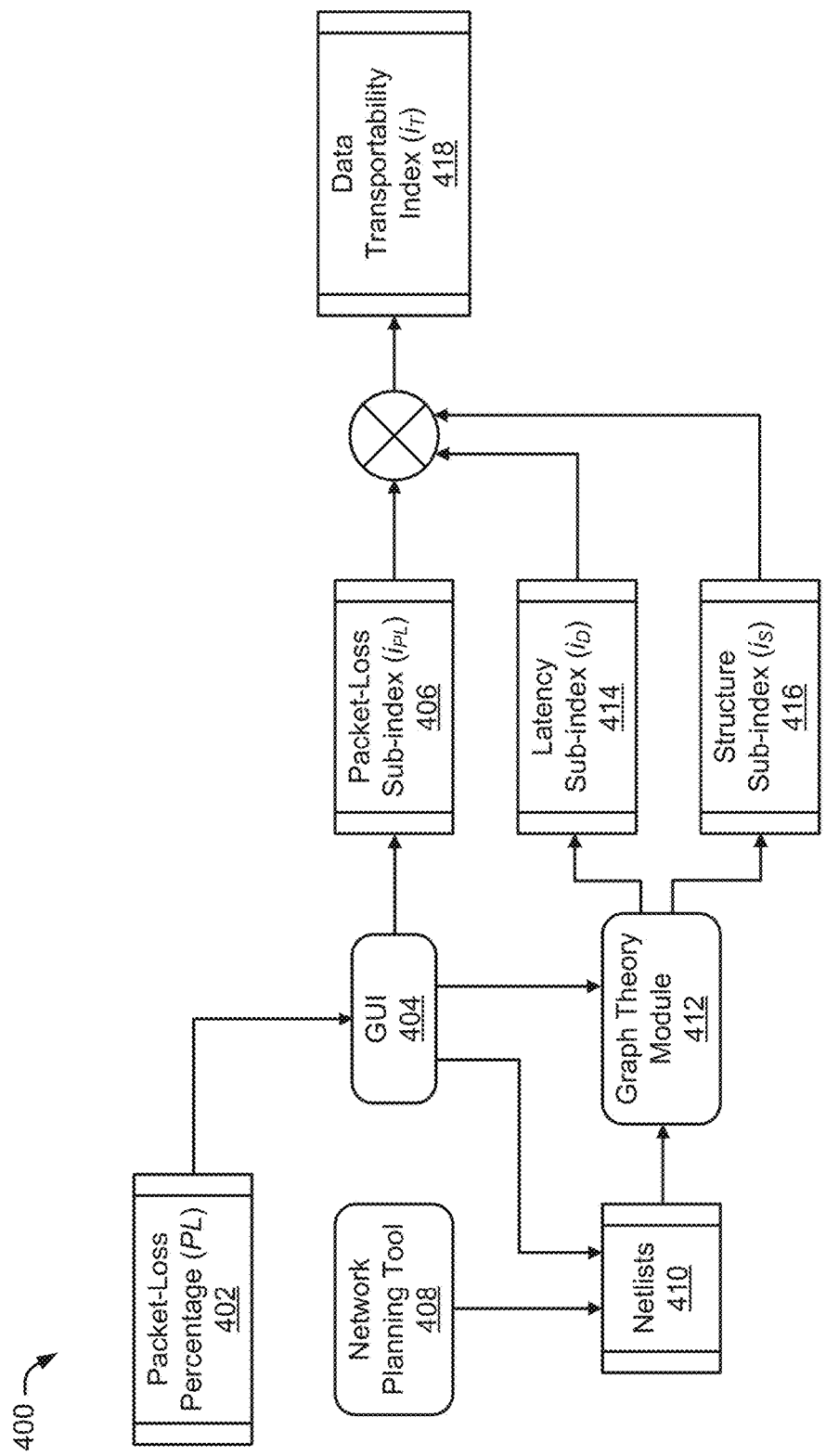
FIG. 4 is a high-level flow chart of a process flow to evaluate and improve data transportability of a communication system connected to a distribution grid.

FIG. 4 is a high-level flow chart of a process flow 400 to evaluate and improve data transportability index ($i_T$) 418 of a communication system connected to a distribution grid. The communication system can be the communication system 202 of FIG. 2 within and connected to the distribution grid 102. The communication system 202 can also represent at least a portion of the communication system within and connected to the distribution grid 102. The process flow 400 can include the communication model 204 of FIG. 2.

The process flow 400 provides information about the efficacy of the communication system 202. In particular, the process flow 400 analyzes the ability of the communication system 202 to support the observability of the distribution grid 102. Distribution engineers can use the process flow 400 to generate several indices or sub-indices (e.g., scores in the range of 0.0 to 1.0) to evaluate the packet loss, latency, and/or structure of the communication system 202. The packet-loss, latency, and/or structure sub-indices can be combined into a single, overall transportability index (e.g., a score in the range of 0.0 to 1.0).

The process flow 400 can be implemented using hardware, software, firmware, or a combination thereof. As an example, a computer system may perform the operations of the process flow 400. The computer system can include one or more processors and computer-readable storage media. Applications and an operating system implemented as computer-readable instructions on the computer-readable storage media can be executed by one or more processors to provide some or all of the functions described in this document. For example, the computer-readable storage media can include the process flow 400. The process flow 400 can be loaded from another computer system or another application. Distribution engineers can also generate the process flow 400 on the same computer system that implements the grid planning tool 200 and the system model 206 of FIG. 2 and the grid planning tool 300 of FIG. 3.

The process flow 400 can include a graphical user interface (GUI) 404 for a distribution engineer to provide or load data and determine the data transportability index 418 of the communication system 202. The GUI 404 can be provided on a computer display or other display associated with the process flow 400. For example, the GUI 404 can be provided by the same computer system running the process flow 400. In other implementations, the GUI 404 can be located remotely from the computer system running the process flow 400.

Distribution engineers can provide a packet-loss percentage (PL) 402 for the communication system 202. The packet-loss percentage 402 can be a global average value provided by distribution engineers for similar or typical communication systems connected to distribution grids. Because the process flow 400 can be used during the planning stages of a monitoring system for the distribution grid 102, distribution engineers may not have specific packet-loss percentages for the communication system 202. Distribution engineers, however, can use previous experience and engineering judgment to provide an average value (e.g., one percent).

The process flow 400 can use the packet-loss percentage 402 to determine a packet-loss sub-index ($i_{PL}$) 406 for the communication system 202. The packet-loss sub-index 406 accounts for the average effect of packet losses on observability and visibility in the distribution grid 102. The process flow 400 can determine the packet-loss sub-index ($i_{PL}$) 406 as one minus the quotient of the packet-loss percentage (PL) 402 and one hundred (e.g., $$i_{PL} = 1 - \frac{PL}{100}).$$

In some implementations, the process flow 400 can omit the packet-loss sub-index 406 because the value is very near to 1.0 (e.g., equal to 0.99 or higher).

The process flow 400 can also include a network planning tool 408 or input data from the network planning tool 408. The network planning tool 408 can be a software modeler or emulator of communication systems and networks. For example, the network planning tool 408 can be a Graphical Network Simulator-3 (GNS3) or similar software. Distribution engineers can use the network planning tool 408 to generate one or more netlists 410. A netlist 410 can describe the connectivity of the communication system 202 within and connected to the distribution grid 102. The netlist 410 generally includes a list of the vertices (e.g., nodes, routers, switches) and edges (e.g., links, fiber optic cables, copper lines, wireless or radio frequency (RF) connections) in a communication system. In another implementation, distribution engineers can access or load the netlist 410 of a proposed communication system for the distribution grid 102 or a communication system similar to the communication system 202. Distribution engineers can use the GUI 404 to select an appropriate netlist 410 for the process flow 400.

The process flow 400 then uses a graph theory module 412 to analyze the selected netlist 410 and determine the latency sub-index (ID) 414 and the structure sub-index (is) 416. This document describes the operations and processes of the graph theory module 412 in greater detail with respect to FIGS. 5 and 6. The latency sub-index 414 evaluates the effect of changing a preferred communication path (e.g., from a link or node failure) on point-to-point latency (e.g., delay) in the communication system 202. Distribution engineers can use the latency sub-index 414 to assess the ability of the communication system 202 and the distribution grid 102 to perform real-time functions, including grid protection or grid control. The structure sub-index 416 evaluates the availability of multiple routes for data flows within the communication system 202. Distribution engineers can use the structure sub-index 416 to assess the usefulness of a proposed network structure, including a ring, mesh, or tree structure, for the communication system 202.

The process flow 400 can then determine the data transportability index ($i_T$) 418. The data transportability index 418 can be calculated as the product of the packet-loss sub-index 406, the latency sub-index 414, and the structure sub-index 416 (e.g., $i_T = i_{PL} \times i_D \times i_S$). In other implementations, the process flow 400 can determine the data transportability index 418 as the product of the latency sub-index 414 and the structure sub-index 416 (e.g., $i_T = i_D \times i_S$). In this way, the process flow 400 can characterize the structure and performance of the communication system 202 globally and not just for a certain subset thereof. The process flow 400 can also comprehensively characterize the structure and performance for all possible uses within the distribution grid 102, including those not yet identified or defined, and not just for selected or known use cases. In this way, the process flow 400 can assist in future-proofing the design of the communication system 202 and avoid stranded investments and unrealized benefits.

Figure 5:
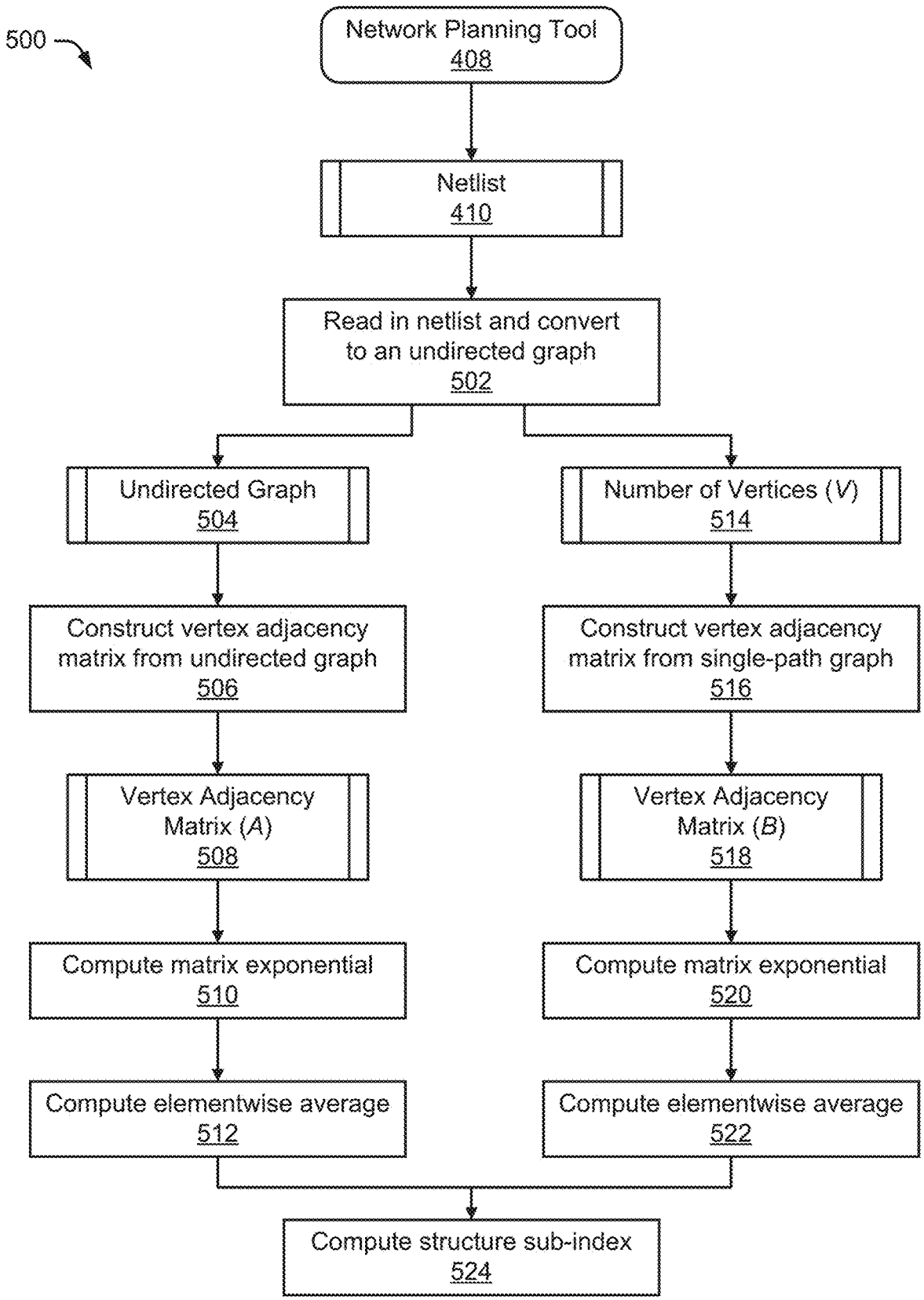
FIG. 5 is a high-level flow chart of a process flow to determine a structure sub-index of a communication system connected to a distribution grid.

FIG. 5 is a high-level flow chart 500 of a process flow to determine the structure sub-index 416 of a communication system connected to a distribution grid. The communication system of FIG. 5 can be the communication system 202 of FIG. 2 within and connected to the distribution grid 102. The communication system 202 can also represent at least a portion of the communication system within and connected to the distribution grid 102. The process flow of FIG. 5 can include the communication model 204 of FIG. 2 or the process flow 400 of FIG. 4.

As described with respect to FIG. 4, the process flow 400 can include the network planning tool 408 or input data from the network planning tool 408. Distribution engineers can use the network planning tool 408 to generate the netlist 410. Distribution engineers can also access or load the netlist 410 of a proposed communication system for the distribution grid 102 or a communication system similar to the communication system 202.

At 502, the process flow 400 can read in the netlist 410 and convert the netlist 410 to an undirected graph 504. The undirected graph 504 provides a topological representation of the vertices (e.g., nodes) and edges (e.g., links) of the communication system within or connected to the distribution grid 102. Bidirectional edges generally connect together the vertices of the undirected graph 504. For example, the undirected graph 504 can include a V number of vertices and an E number of edges, where V can be equal to or different than E. The process flow 400 can determine the number of vertices (V) 514 in the undirected graph 504.

At 506, the process flow 400 can determine or construct a vertex adjacency matrix (A) 508 from the undirected graph 504. The vertex adjacency matrix 508 indicates which vertices or nodes are connected in the communication system 202 and via which edges or links. The vertex adjacency matrix 508 can be represented by Equation (1):

$$A = (a_{ij});\ a_{ij} = \begin{cases} 1 & \text{if } (i,j) \text{ is an edge} \\ 0 & \text{else} \end{cases} \quad (1)$$

The vertex adjacency matrix 508 is generally binary because the edges are unweighted. The vertex adjacency matrix 508 generally has zeros along its diagonal if the undirected graph 504 does not include loops (e.g., no edges from node i to itself). In addition, the vertex adjacency matrix 508 is generally symmetric because of the bidirectional nature of the edges in the undirected graph 504.

At 510, the process flow 400 can determine or compute a matrix exponential $e^A$ using the vertex adjacency matrix (A) 508. The matrix exponential generally indicates the ease to proceed from one vertex to another vertex in the communication system 202. The matrix exponential can be calculated using a power series expansion as represented by Equation (2):

$$e^A = \sum_{k=0}^{\infty} \frac{A^k}{k!} \quad (2)$$

A walk of length k on the undirected graph 504 represents a sequence of vertices (e.g., $v_1, v_2, \ldots, v_{k+1}$) such that $(v_i, v_{i+1}) \in E$, where E represents the edges of the undirected graph 504, for all $1 \le i \le k$. A path represents a walk with no repeated vertices.

At 512, the process flow 400 can determine an average communicability $C_{network}$ for the communication system 202 by computing an elementwise average of entries in the matrix exponential $e^A$. The elementwise average represents an average communicability for the communication system 202, where communicability represents the ease of sending information across the communication system 202. The process flow 400 can use Equation (3) to determine the elementwise average of the matrix exponential $e^A$:

$$C_{network}(A) = \Sigma_{i=1}^{n}[e^A 1]_i = \Sigma_{i=1}^{n}\Sigma_{k=1}^{n}e^{\lambda_j}(v_i^T 1)v_{ki} = 1^T e^A 1 \quad (3)$$

where $\lambda_k$ is the kth eigenvalue of A and $v_{ik}$ is the ith element of the normalized eigenvector $v_k$ associated with $\lambda_k$.

At 516, the process flow 400 can determine or construct another vertex adjacency matrix (B) 518 using a single-path graph (e.g., a path graph) with the number of vertices (V) 514. A single-path graph generally contains a single path through all of its vertices. The number of edges in a single-path graph is equal to the number of vertices (V) 514 minus one. The vertex adjacency matrix (B) 518 can be represented by Equation (4):

$$B = (b_{ij});\ b_{ij} = \begin{cases} 1 & \text{if } (i,j) \text{ is an edge} \\ 0 & \text{else} \end{cases} \quad (4)$$

At 520, the process flow 400 can determine or compute another matrix exponential $e^B$ using the vertex adjacency matrix (B) 518. The other matrix exponential can be calculated using a power series expansion as represented by Equation (5):

$$e^B = \sum_{k=0}^{\infty} \frac{B^k}{k!} \quad (5)$$

At 522, the process flow 400 can determine a smallest-possible average communicability $C_{SP}$ for the communication system 202 by computing an elementwise average of entries in the matrix exponential $e^B$. The smallest-possible elementwise average represents the smallest possible average communicability of a graph with the number of vertices (V) 514. The process flow 400 can use Equation (6) to determine the smallest-possible elementwise average of the matrix exponential $e^B$:

$$C_{SP}(B) = \Sigma_{i=1}^{n}[e^B 1]_i = \Sigma_{i=1}^{n}\Sigma_{k=1}^{n}e^{\lambda_j}(v_i^T 1)v_{ki} = 1^T e^B 1 \quad (6)$$

where $\lambda_k$ is the kth eigenvalue of B and $v_{ik}$ is the ith element of the normalized eigenvector $v_k$ associated with $\lambda_k$.

At 524, the process flow 400 can determine or compute the structure sub-index (is) 416 for the communication system 202. The structure sub-index 416 is equal to the maximum of zero or one minus the quotient of the smallest-possible average communicability $C_{SP}$ and the average communicability for the communication system $C_{network}$. In this way, the process flow 400 can normalize the communicability of the communication system 202. The process flow 400 can use Equation (7) to determine the structure sub-index 416:

$$i_S = \max\left[0, \left(1 - \frac{C_{SP}}{C_{network}}\right)\right] \quad (7)$$

Figure 6:
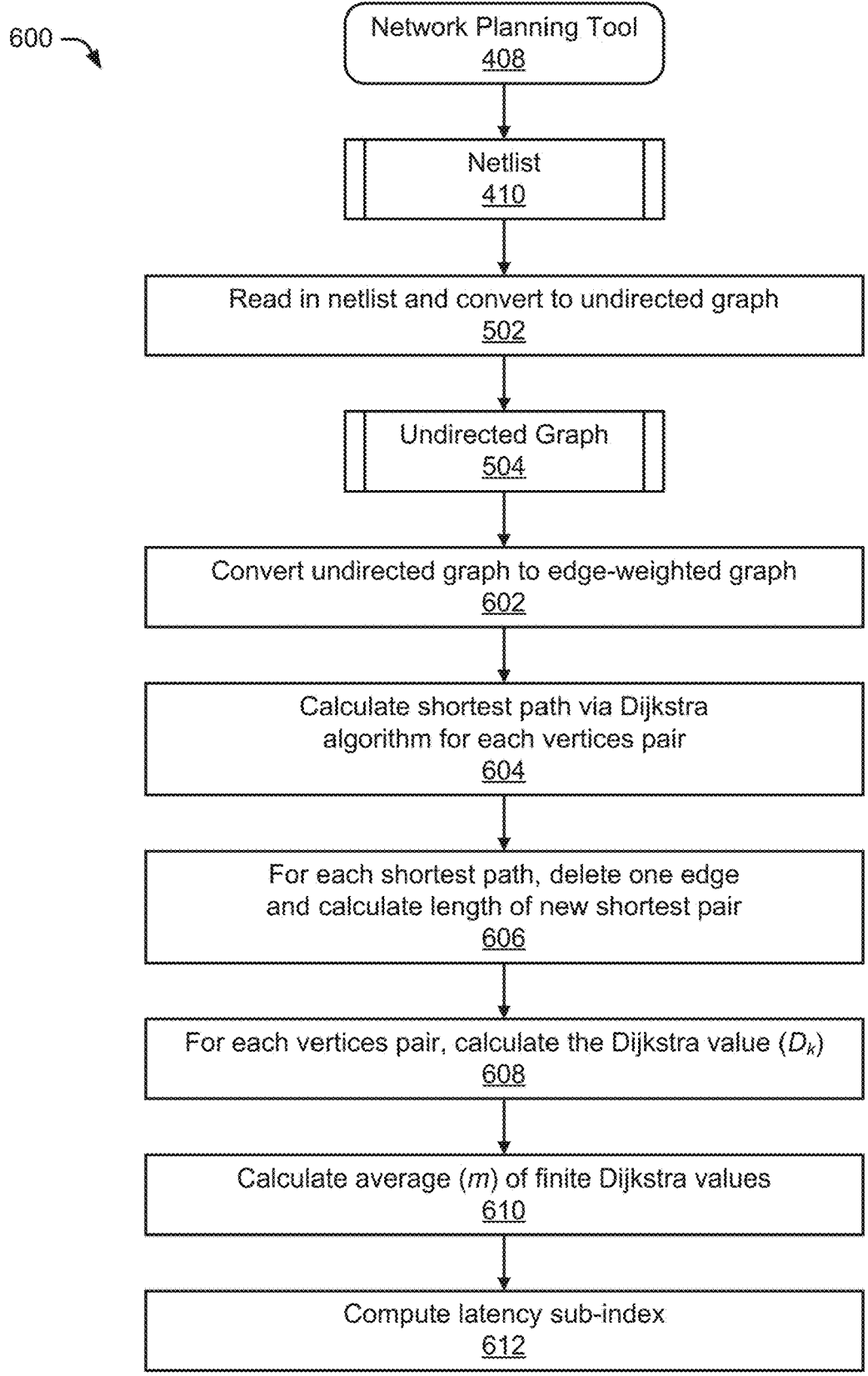
FIG. 6 is a high-level flow chart of a process flow to determine a latency sub-index of a communication system connected to a distribution grid.

FIG. 6 is a high-level flow chart 600 of a process flow to determine the latency sub-index 414 of a communication system connected to a distribution grid. The communication system of FIG. 6 can be the communication system 202 of FIG. 2 within and connected to the distribution grid 102. The communication system 202 can also represent at least a portion of the communication system within and connected to the distribution grid 102. The process flow of FIG. 6 can include the communication model 204 of FIG. 2 or the process flow 400 of FIG. 4.

As described with respect to FIG. 4, the process flow 400 can include the network planning tool 408 or input data from the network planning tool 408. Distribution engineers can use the network planning tool 408 to generate the netlist 410. Distribution engineers can also access or load the netlist 410 of a proposed communication system for the distribution grid 102 or a communication system similar to the communication system 202.

As described with respect to FIG. 5 and at 502, the process flow 400 can read in the netlist 410 and convert the netlist 410 to the undirected graph 504. The undirected graph 504 provides a topological representation of the vertices (e.g., nodes) and edges (e.g., links) of the communication system within or connected to the distribution grid 102. Bidirectional edges generally connect together the vertices of the undirected graph 504.

At 602, the process flow 400 can convert the undirected graph 504 to an edge-weighted graph. The edges of the edge-weighted graph have a weight associated with latencies created by the corresponding edge (e.g., link). In other words, the weights of the edge-weighted graph represent latencies of the communication system 202.

At 604, the process flow 400 can determine or calculate the shortest path which in this case means the lowest-weighted-sum path for each pair of vertices of the edge-weighted graph. The process flow 400 can use an algorithm (e.g., Dijkstra's algorithm) to determine the lowest-weighted-sum path. Using Dijkstra's algorithm, the process flow 400 can generate a shortest path tree with a given vertex as the root. The process flow 400 can maintain two sets of vertices: a first set that includes vertices in the shortest path tree and a second set that includes vertices not yet included in the shortest path tree. At each step of the algorithm, the process flow 400 determines a vertex that is in the second set and has a minimum distance or lowest weight from the source. In this way, the process flow 400 can determine the lowest-weighted-sum path between each pair of vertices in the edge-weighted graph. In other implementations, the process flow 400 can use Prim's algorithm or another method to determine the lowest-weighted-sum path.

At 606 and for each lowest-weighted-sum path or shortest path, the process flow 400 can remove or delete one edge at a time and determine a length of a new lowest-weighted-sum path for the corresponding pair of vertices. The process flow 400 can ignore cases where a vertex or a pair of vertices become disconnected by deleting or removing an edge.

At 608 and for each pair of vertices, the process flow 400 then determines or calculates a Dijkstra value ($D_k$). The Dijkstra value being equal to the quotient of the new lowest-weighted-sum path minus the lowest-weighted-sum path and the lowest-weighted-sum path, which is represented by Equation (8):

$$D_k = \frac{\text{(new lowest weighted sum path} - \text{lowest weighted sum path)}}{\text{lowest weighted sum path}} \quad (8)$$

At 610, the process flow 400 can determine or calculate an average (m) of each finite Dijkstra value. As described earlier, the process flow 400 can ignore cases where a vertex or a pair of vertices become disconnected by deleting or removing an edge, resulting in the Dijkstra value going towards infinity.

At 612, the process flow 400 can determine or compute the latency sub-index 414. The latency sub-index can be calculated as the exponential of negative one times the average of each finite Dijkstra value (m), which is represented by Equation (9):

$$i_D = e^{-m} \quad (9)$$

In this way, the latency sub-index 414 is based on the average fractional increase in latency (e.g., delay) for the communication system 202 when an edge in the shortest path becomes unavailable. As the average (m) increases, the latency sub-index 414 decreases, which indicates that the communication system 202 is not latency-resilient. The latency sub-index 414 evaluates latency growth in the communication system 202 due to an edge loss across the set of possible shortest path edge losses for each pair of vertices.

Example Observability Analysis

Figure 7:
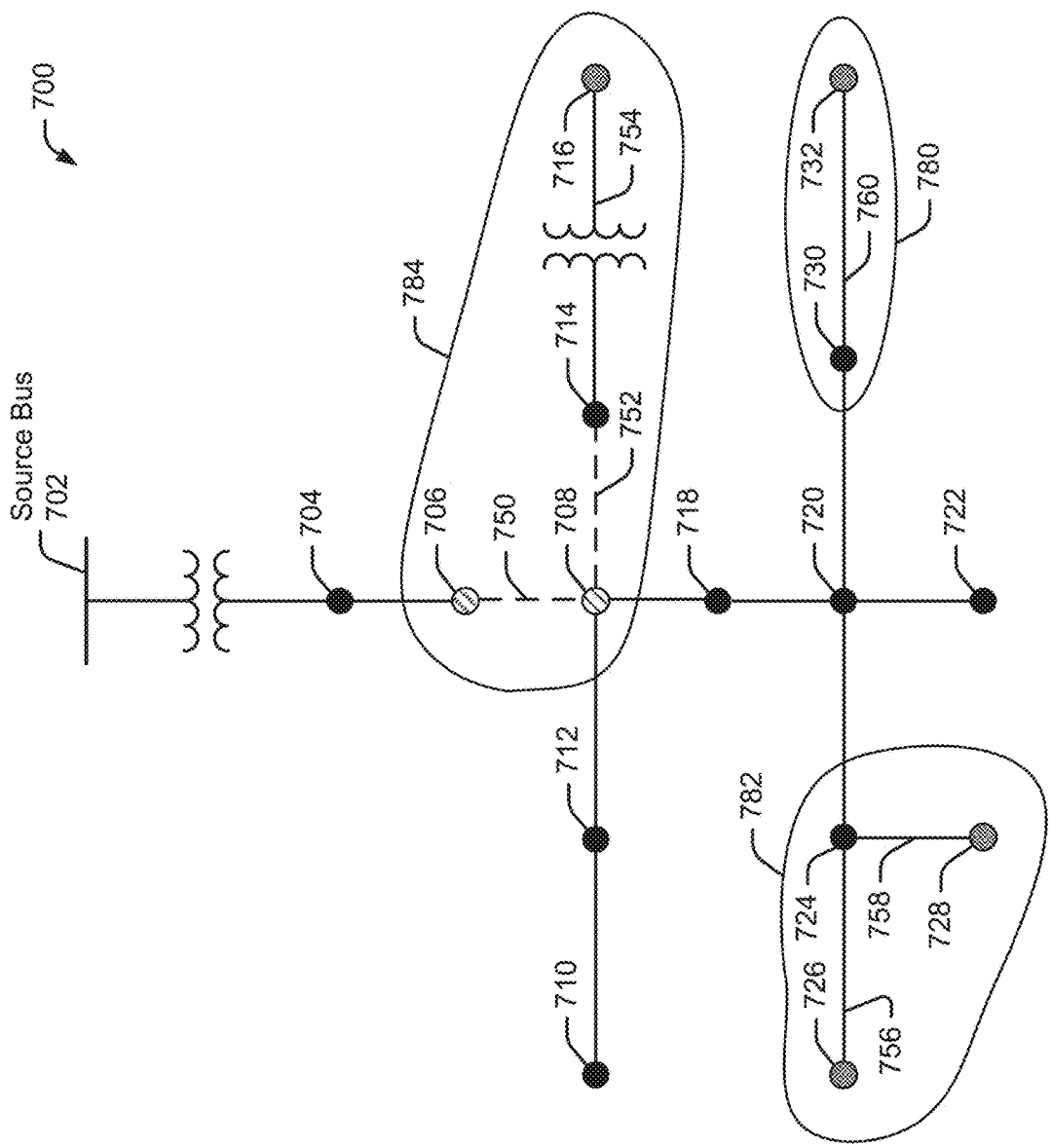
FIG. 7 illustrates an example system model of a distribution grid.

FIG. 7 illustrates an example system model 700 of the distribution grid 102. Distribution engineers can use the described systems and techniques to identify the visibility and observability of the system model 700 and the distribution grid 102. In other words, distribution engineers can use the system model 700 to establish a base case for the distribution grid 102.

The system model 700 assumes that the distribution grid 102 has a transportability of 1.0. An index value of 1.0 for the transportability indicates that there are no losses in the transmission of sensor data to distribution engineers of the distribution grid 102. As described above, the transportability can be determined by analyzing a communication model (e.g., the communication model 204 of FIG. 2) or estimated based on input from distribution engineers that are familiar with the communication system (e.g., the communication system 202) of the distribution grid 102. The system model 700 also assumes that the model validity is 0.93, which correlates to the system model 700 being approximately 93% accurate in modeling the distribution grid 102.

The system model 700 includes a source bus 702 and nodes 704 through 732. The nodes 704, 714, 722, and 724 are unloaded unmeasured nodes. The nodes 710, 712, 718, 720, and 730 are loaded unmeasured nodes. No sensor data is available for the unmeasured nodes 704, 710, 712, 714, 718, 720, 722, 724, and 730 in the system model 700. The unmeasured nodes are illustrated as black, solid-filled nodes in FIG. 7.

The system model 700 includes six point-measurement sensors at the nodes 706, 708, 716, 726, 728, and 732. In this implementation, the point-measurement sensors obtain a voltage reading. The nodes 716, 726, 728, and 732 also include an injection-measurement sensor to obtain a current reading. In FIG. 7, the voltage-only point-measurements are illustrated as hatched nodes, and the voltage and current point-measurements are illustrated as black, cross-hatched nodes.

The system model 700 also includes two flow sensors. The flow sensors obtain current-flow or power-flow readings at the buses 750 and 752. The flow sensors are illustrated as dashed lines in FIG. 7.

The measurement fraction of the system model 700 is 0.255. A measurement fraction of 0.255 indicates that approximately 25% of the nodes and buses in the distribution grid 102 have measurement data available. As discussed above, the system model 700 includes six point-measurement sensors (e.g., at the nodes 706, 708, 716, 726, 728, and 732), four injection-measurement sensors (e.g., at the nodes 716, 726, 728, and 732), and two flow-measurement sensors (e.g., at the buses 750 and 752). The system model 700 and the distribution grid 102 include 47 potential measurements: 16 potential point measurements, 16 potential injection measurements, and 15 flow measurements. With a transportability index of 1.0, the system model 700 has a model visibility index of 0.255 (e.g., 1.0 visibility index×(12 actual measurements÷47 potential measurements)). With a model validity of 0.93, the system visibility index of the distribution grid 102 is approximately 0.237 (e.g., 0.255 model visibility×0.93 model validity).

The estimation fraction of the system model 700 is 0.17 (e.g., 8 estimated measurements÷47 potential measurements). The distribution grid 102 includes eight measurement points that can be estimated based on actual sensor measurements. In this implementation, a point measurement at the node 714 can be estimated based on the point measurement at node 708 and the flow measurement at bus 752. Injection measurements at the nodes 714, 724, and 730 can be estimated using substitution based on the adjacent-bus injection measurements of the nodes 708 and 716, the nodes 726 and 728, and the node 732, respectively. In addition, flow measurements at the buses 754, 756, 758, and 760 can be estimated based on the injection measurements at the nodes 716, 726, 728, and 732, respectively.

For the system model 700, the estimation fraction of 0.17 is summed with the measurement fraction of 0.255 and multiplied by the transportability index to determine a model observability index of 0.425. The model observability index is then multiplied by the model validity of 0.93, which results in a system observability index of 0.396 for the distribution grid 102.

In the system model 700 of FIG. 7, three islands of observability 780, 782, and 784 exist around the actual measurements of the distribution grid 102. The center and some extremities of the system model 700 are not part of the islands of observability 780, 782, and 784 because there are no nearby actual measurements. The islands of observability 780, 782, and 784 provide a graphical representation of the observability of the distribution grid 102. This graphical representation can be used by distribution engineers, as discussed below with respect to FIG. 8, to determine the number and locations of sensors to add to the distribution grid 102 to improve its system observability.

Figure 8:
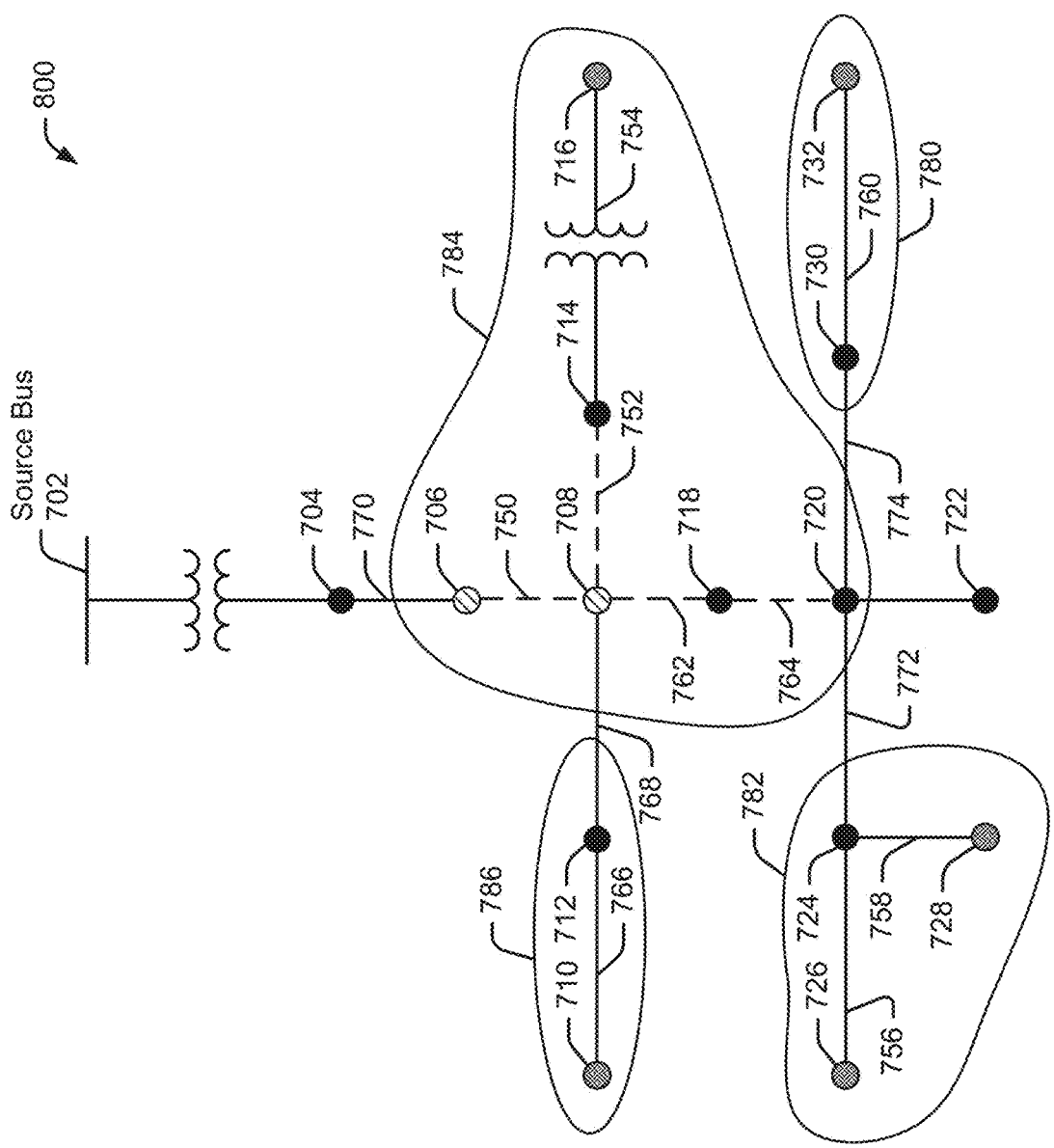
FIG. 8 illustrates an example system model of a distribution grid with improved visibility and observability.

FIG. 8 illustrates a system model 800 of the distribution grid 102 with improved visibility and observability. The system model 800 is used to improve the system visibility and the system observability of the distribution grid 102 by adding new sensors. As described below, a small increase in the number of actual measurements results in a substantial increase in the system observability of the distribution grid 102.

The system model 800 is similar to the system model 700 of FIG. 7 but includes four additional sensor measurements. In particular, a new point-measurement sensor and a new injection-measurement sensor are added at the node 710. Two new flow-measurement sensors are also added at buses 762 and 764.

The additional sensor measurements result in a new island of observability 786, which encompasses node 710, node 712, and a bus 766. The island of observability 784 is enlarged to include the nodes 718 and 720.

In the system model 800, the measurement fraction has slightly increased from 0.255 to 0.34 (e.g., 16 actual measurements÷47 potential measurements). The larger measurement fraction results from the new point measurement at the node 710, the new injection measurement at the node 710, and the new flow measurements at the buses 762 and 764. The model visibility is 0.34 (e.g., 0.34 measurement fraction×1.0 transportability) and the system visibility is 0.3176 (e.g., 0.34 model visibility×0.93 model validity).

The estimation fraction for the system model 800 is 0.726 (e.g., 20 estimated measurements÷47 potential measurements). The four new sensor measurements increased the number of estimated measurements from eight to 20. In particular, voltage and current measurements can be estimated at the nodes 718 and 720, current measurements can be estimated at the nodes 706, 708, and 712, and flow measurements can be estimated at buses 766, 768, 770, 772, and 774. Factoring in the measurement fraction and the transportability, the system model 800 has a model observability of 0.766 (e.g., 1.0 transportability×(0.34 measurement fraction+0.726 estimation fraction)) and a system observability of 0.712 (e.g., 0.766 model observability×0.93 model validity).

The system visibility of the system model 800 increased by 0.085, which is an increase of approximately 33%. The system observability increased by 0.34, which is an increase of about 80%. As depicted by system model 800, a small increase in the number of sensors and their strategic placement can result in significant improvements in the system observability of the distribution grid 102.

Example Methods

Figure 9:
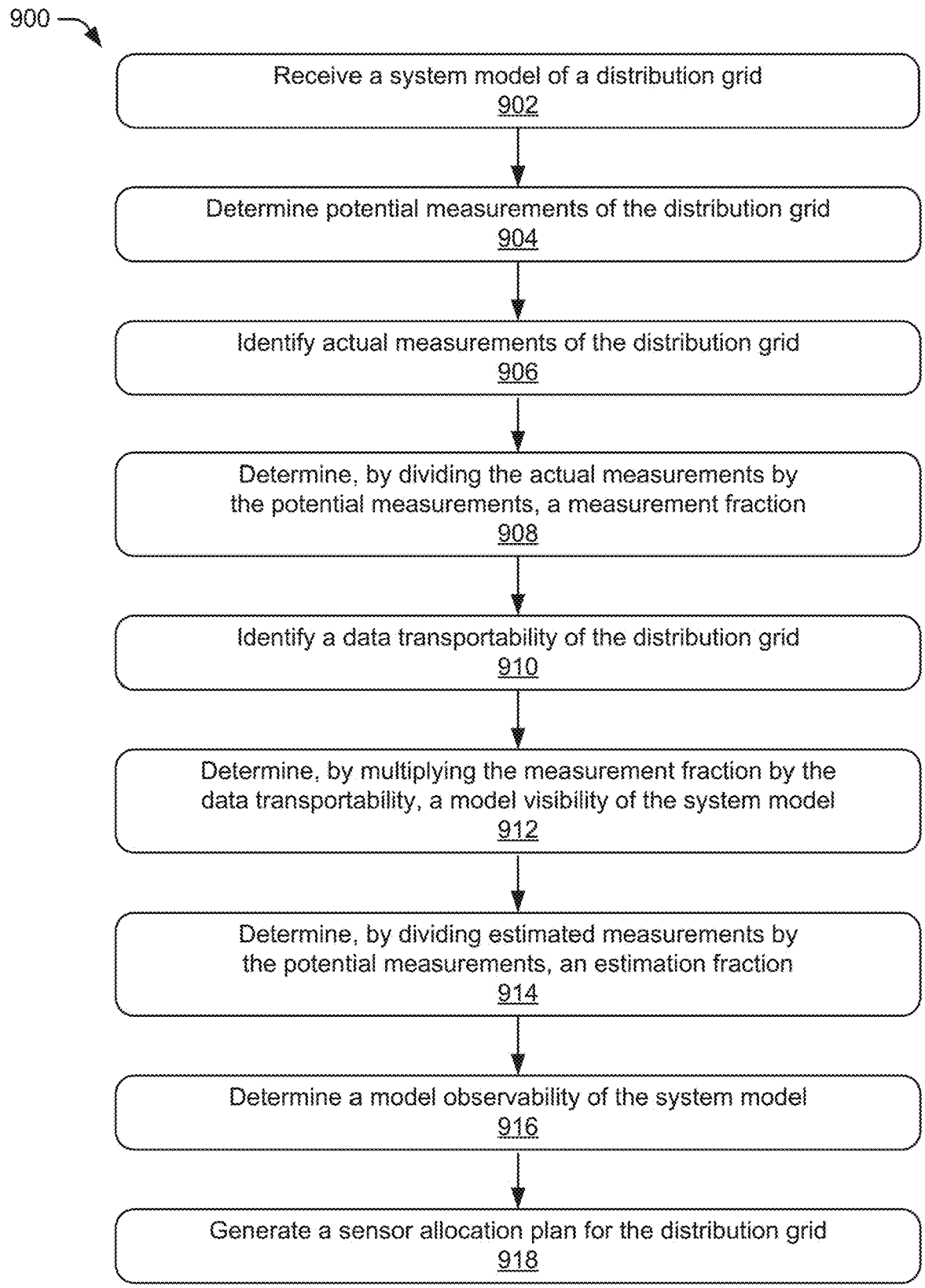
FIG. 9 illustrates an example method for determining sensor allocation in a distribution grid.

FIG. 9 illustrates an example method 900 for determining sensor allocation in a distribution grid. The series of operational blocks 902-918 that describe the method 900 are not to be construed as a limitation, as one or more of the described operational blocks 902-918 can be combined using different elements or ordering to implement the method 900 or an alternate, derivative method. In addition, one or more of the operational blocks 902-918 can be omitted from the method 900. Furthermore, although described in the context of being performed by or via a computer system, portions of the method 900 may be divided or allocated across multiple computer systems. The method 900 may use elements of FIGS. 1-8.

At 902, a system model of a distribution grid is received by a grid planning tool. The system model provides a representation of circuits, sensors, and locations of sensors within the distribution grid. For example, the system model 700, which provides a representation of the distribution grid 102, is received by the grid planning tool 200. The system model 700 includes the following circuits: the source bus 702 and the nodes 704-732. The system model 700 also includes six point-measurement sensors at the nodes 706, 708, 716, 726, 728, and 732. Voltage readings are obtained by the point-measurement sensors. The nodes 716, 726, 728, and 732 in the system model 700 also include injection-measurement sensors. Current or power readings are obtained by the injection-measurement sensors. The system model 700 also includes two flow sensors at the buses 750 and 752 that obtain current-flow or power-flow measurements.

At 904, potential measurements of the distribution grid are determined from the system model. For example, the distribution grid 102, as illustrated in FIGS. 7 and 8, has 47 potential measurements. In particular, the distribution grid 102 includes 16 nodes, at which both a point measurement and an injection measurement are possible, and 15 buses, at which flow measurements are possible.

At 906, actual measurements of the distribution grid are identified based on the sensors and the locations of the sensors. The actual measurements can include at least one of a point measurement, a flow measurement, or an injection measurement. For example, the distribution grid 102, as illustrated by the system model 700 of FIG. 7, includes six point-measurement sensors (e.g., at the nodes 706, 708, 716, 726, 728, and 732), four injection-measurement sensors (e.g., at the nodes 716, 726, 728, and 732), and two flow-measurement sensors (e.g., at the buses 750 and 752). In other words, the distribution grid 102 includes 12 actual measurements.

At 908, a measurement fraction is determined by dividing the actual measurements by the potential measurements. For example, the measurement fraction of the system model 700 is 0.255, which is obtained by dividing the 12 actual measurements by the 47 potential measurements.

At 910, a data transportability of the distribution grid is identified. The data transportability comprises an index value of a capability of the distribution grid to deliver measurement data. For example, the distribution grid 102 has a data transportability of 1.0. An index value of 1.0 for the data transportability indicates that there are no losses in transmission of measurement data to distribution engineers of the distribution grid 102.

At 912, a model visibility of the system model is determined by multiplying the measurement fraction by the data transportability. The model visibility comprises an index value of a capability to obtain useable data in the distribution grid. For example, the system model 700 has a model visibility of 0.255, which is determined by multiplying the measurement fraction of 0.255 by the data transportability of 1.0.

At 914, an estimation fraction is determined by dividing estimated measurements by the potential measurements. The estimated measurements comprise unmeasured points of the potential measurements that can be estimated using the actual measurements. For example, the distribution grid 102 includes eight measurement points that can be estimated based on actual measurements. For the distribution grid 102, a voltage measurement at the node 714 can be estimated based on the voltage measurement at the node 708 and the flow measurement at bus 752. Current measurements at the nodes 714, 724, and 730 can be estimated using substitution based on the adjacent-bus current measurements of the nodes 708 and 716, the nodes 726 and 728, and the node 732, respectively. In addition, flow measurements at the buses 754, 756, 758, and 760 can be estimated based on the current measurements at the nodes 716, 726, 728, and 732, respectively. The estimation fraction of the distribution grid 102 is 0.17, which is determined by dividing the 8 estimated measurements by the 47 potential measurements.

At 916, a model observability of the system model is determined by multiplying the data transportability by a sum of the measurement fraction and the estimation fraction. The model observability comprises a capability to combine the actual measurements and the estimated measurements to determine operating parameters for the distribution grid. For example, the sum of the measurement fraction (e.g., 0.255) and the estimation fraction (e.g., 0.17) for the system model 700 is 0.425. The model observability of the system model 700 is 0.425 (e.g., 1.0 data transportability×0.425).

At 918, a sensor allocation plan for the distribution grid is generated using the model visibility and the model observability. The sensor allocation plan indicates one or more new sensors and locations of the one or more new sensors within the distribution grid. For example, the system model 800 includes four additional sensor measurements that are not included in the system model 700. In particular, a new point-measurement sensor and a new injection-measurement sensor are added at the node 710, and two new flow-measurement sensors are added at buses 762 and 764. The additional actual measurements increase the measurement fraction of the system model 800 from 0.255 to 0.34, which results in a model visibility of 0.34 and a system visibility of 0.3166 for the system model 800. The new sensor measurements also increase the model observability of the system model 800 from 0.425 to 0.766. Similarly, the system observability of the system model 800 increases from 0.396 to 0.712. By iteratively placing new sensors in the system model 800, distribution engineers of the distribution grid 102 can generate a sensor allocation plan using the model visibility and model observability of the system model 800 in comparison to the system model 700.

FIG. 10 illustrates an example method 1000 for determining data transportability of a communication system within or connected to a distribution grid. The series of operational blocks 1002-1012 that describe the method 1000 are not to be construed as a limitation, as one or more of the described operational blocks 1002-1012 can be combined using different elements (e.g., the operational blocks 902-918 of the method 900) or ordering to implement the method 1000 or an alternate, derivative method. In addition, one or more of the operational blocks 1002-1012 (e.g., the operational block 1008) can be omitted from the method 1000. Furthermore, although described in the context of being performed by or via a computer system, portions of the method 1000 may be divided or allocated across multiple computer systems. The method 1000 may use each or a subset of the elements of FIGS. 1-9.

At 1002, a netlist is converted to an undirected graph. The undirected graph provides a representation of one or more vertices and edges of a communication system within or connected to a distribution grid. For example, the process flow 400 can use the network planning tool 408 to convert the netlist 410 to the undirected graph 504. The netlist 410 describes the connectivity of the communication system 202 within and connected to the distribution grid 102.

At 1004, a structure sub-index for the communication system is determined based on the undirected graph. For example, the process flow 400 can use the graph theory module 412 to analyze the netlist 410 and the undirected graph 504 and determine the structure sub-index 416 for the communication system 202. The operations of the graph theory module 412 to determine the structure sub-index 416 are described in greater detail with respect to FIG. 5.

At 1006, a latency sub-index for the communication system is determined based on the undirected graph. For example, the process flow 400 can use the graph theory module 412 to analyze the netlist 410 and the undirected graph 504 and determine the latency sub-index 414 for the communication system 202. The operations of the graph theory module 412 to determine the latency sub-index 414 are described in greater detail with respect to FIG. 6.

At 1008, a packet-loss sub-index is determined. In some implementations, the packet-loss sub-index need not be determined. For example, distribution engineers can provide the packet-loss percentage 402 for the communication system 202. Distribution engineers can also use previous experience and engineering judgment to provide an average value for the packet-loss percentage 402. The process flow 400 can use the packet-loss percentage 402 to determine the packet-loss sub-index 406 for the communication system 202 as described in greater detail with respect to FIG. 4.

At 1010, the data transportability of the distribution grid is determined using the structure sub-index, the latency sub-index, and/or the packet loss sub-index. The data transportability is equal to the product of the structure sub-index, the latency sub-index, and the packet-loss sub-index (if available). For example, the process flow 400 can determine the data transportability index 418 as the product of the packet-loss sub-index 406, the latency sub-index 414, and the structure sub-index 416. In other implementations, the process flow 400 can determine the data transportability index 418 as the product of the latency sub-index 414 and the structure sub-index 416.

At 1012, a sensor allocation plan for the distribution grid is generated using the data transportability. The sensor allocation plan indicates one or more new sensors and locations of the one or more new sensors to be placed within the distribution grid. For example, the system model 800 includes four additional sensor measurements that are not included in the system model 700. In particular, a new point-measurement sensor and a new injection-measurement sensor are added at the node 710, and two new flow-measurement sensors are added at buses 762 and 764. The additional actual measurements increase the measurement fraction of the system model 800 from 0.255 to 0.34, which results in a model visibility of 0.34 and a system visibility of 0.3166 for the system model 800. The new sensor measurements also increase the model observability of the system model 800 from 0.425 to 0.766. Similarly, the system observability of the system model 800 increases from 0.396 to 0.712. By iteratively placing new sensors in the system model 800, distribution engineers of the distribution grid 102 can generate a sensor allocation plan using the model visibility and model observability of the system model 800 in comparison to the system model 700. The data transportability index 418 represents the ability of the communication system 202 to support the observability of the distribution grid 102.

The foregoing detailed description provides exemplary embodiments of the invention and includes the best mode for practicing the invention. The description and illustration of these embodiments are intended only to provide examples of the invention, and not to limit the scope of the invention, or its protection, in any manner.

What is claimed is:

1. A method for sensor allocation in a distribution grid, the method comprising:
    converting a netlist to an undirected graph, the undirected graph providing a representation of one or more vertices and edges of a communication system within or connected to the distribution grid;
    determining, based on the undirected graph, a structure sub-index for the communication system;
    determining, based on the undirected graph, a latency sub-index for the communication system;
    determining, using the structure sub-index and the latency sub-index, a data transportability of the distribution grid, the data transportability comprising a product of the structure sub-index and the latency sub-index;
    receiving a system model of the distribution grid, wherein the system model provides a representation of circuits, sensors, and locations of the sensors within the distribution grid;
    determining, from the system model of the distribution grid, potential measurements of the distribution grid;
    identifying, based on the sensors and the locations of the sensors in the system model, actual measurements of the distribution grid, the actual measurements including at least one of a point measurement, a flow measurement, or an injection measurement;
    determining, by dividing the actual measurements by the potential measurements, a measurement fraction;
    determining, by multiplying the measurement fraction by the data transportability, a model visibility of the system model;
    determining, by dividing estimated measurements by the potential measurements, an estimation fraction;
    determining, by multiplying the data transportability by a sum of the measurement fraction and the estimation fraction, a model observability of the system model; and
    generating, using the model visibility of the system model and the model observability of the system model, a sensor allocation plan for the distribution grid, wherein the sensor allocation plan indicates one or more new sensors and locations of the one or more new sensors to be placed within the distribution grid.

2. The method of claim 1, wherein determining the structure sub-index comprises:
    determining a first vertex adjacency matrix from the undirected graph;
    determining, using the first vertex adjacency matrix, a first matrix exponential;
    determining an average communicability for the communication system by computing an elementwise average of entries in the first matrix exponential;
    determining a first number of vertices in the undirected graph;
    determining a second vertex adjacency matrix using a single-path graph with the first number of vertices;
    determining, using the second vertex adjacency matrix, a second matrix exponential;
    determining a smallest-possible average communicability for the communication system by computing an elementwise average of entries in the second matrix exponential; and
    determining a structure sub-index for the communication system, the structure sub-index comprising a maximum of zero or one minus a quotient of the smallest-possible average communicability and the average communicability for the communication system.

3. The method of claim 1, wherein determining the latency sub-index for the communication system comprises:
    converting the undirected graph to an edge-weighted graph, weights of the edge-weighted graph being latencies;
    determining, for each pair of vertices of the edge-weighted graph, a lowest-weighted-sum path;
    for each lowest-weighted-sum path, removing one edge at a time and determining a length of a new lowest-weighted-sum path for each pair of vertices;
    determining, for each pair of vertices, a Dijkstra value, the Dijkstra value comprising a quotient of the new lowest-weighted-sum path minus the lowest-weighted-sum path and the lowest-weighted-sum path;
    determining an average of each finite Dijkstra value; and
    determining the latency sub-index, the latency sub-index comprising an exponential of negative one times the average of each finite Dijkstra value.

4. The method of claim 1, the method further comprising:
    determining a packet-loss sub-index, wherein the data transportability comprises a product of the structure sub-index, the latency sub-index, and the packet-loss sub-index.

5. The method of claim 4, wherein determining the packet-loss sub-index comprises:
    determining a packet-loss percentage associated with the communication system or other communication systems similar to the communication system; and
    determining the packet-loss sub-index as one minus a quotient of the packet-loss percentage and one hundred.

6. The method of claim 1,
wherein the model visibility comprises an index value of a capability to obtain useable data in the distribution grid.

7. The method of claim 1,
wherein the estimated measurements comprise unmeasured points of the potential measurements that can be estimated using the actual measurements; and
wherein the model observability comprises a capability to combine the actual measurements and the estimated measurements to determine operating parameters for the distribution grid.

8. The method of claim 1, the method further comprising:
identifying a model validity of the system model, wherein the model validity comprises an index value of an accuracy of the system model; and
determining, by multiplying the model visibility and the model observability by the model validity, a system visibility, and a system observability, respectively, of the distribution grid.

9. The method of claim 8, wherein generating the sensor allocation plan for the distribution grid uses the data transportability, the model visibility, and the model observability.

10. The method of claim 9, wherein the sensor allocation plan is effective to maximize the system observability for at least one of a fixed sensor cost or minimize a sensor cost for a predetermined system observability.

11. A computer-readable storage media comprising computer-executable instructions for sensor allocation in a distribution grid, the computer-executable instructions, when executed, cause one or more processors of a computer system to:
convert a netlist to an undirected graph, the undirected graph providing a representation of one or more vertices and edges of a communication system within or connected to the distribution grid;
determine, based on the undirected graph, a structure sub-index for the communication system;
determine, based on the undirected graph, a latency sub-index for the communication system;
determine, using the structure sub-index and the latency sub-index, a data transportability of the distribution grid, the data transportability comprising a product of the structure sub-index and the latency sub-index;
receive a system model of the distribution grid, wherein the system model provides a representation of circuits, sensors, and locations of the sensors within the distribution grid;
determine, from the system model of the distribution grid, potential measurements of the distribution grid;
identify, based on the sensors and the locations of the sensors in the system model, actual measurements of the distribution grid, the actual measurements including at least one of a point measurement, a flow measurement, or an injection measurement;
determine, by dividing the actual measurements by the potential measurements, a measurement fraction;
determine, by multiplying the measurement fraction by the data transportability, a model visibility of the system model;
determine, by dividing estimated measurements by the potential measurements, an estimation fraction;
determine, by multiplying the data transportability by a sum of the measurement fraction and the estimation fraction, a model observability of the system model; and
generate, using the model visibility of the system model and the model observability of the system model, a sensor allocation plan for the distribution grid, wherein the sensor allocation plan indicates one or more new sensors and locations of the one or more new sensors to be placed within the distribution grid.

12. The computer-readable storage media of claim 11, wherein the computer-executable instructions, when executed to determine the structure sub-index, cause the one or more processors of the computer system to:
determine a first vertex adjacency matrix from the undirected graph;
determine, using the first vertex adjacency matrix, a first matrix exponential;
determine an average communicability for the communication system by computing an elementwise average of entries in the first matrix exponential;
determine a first number of vertices in the undirected graph;
determine a second vertex adjacency matrix using a single-path graph with the first number of vertices;
determine, using the second vertex adjacency matrix, a second matrix exponential;
determine a smallest-possible average communicability for the communication system by computing an elementwise average of entries in the second matrix exponential; and
determine a structure sub-index for the communication system, the structure sub-index comprising a maximum of zero or one minus a quotient of the smallest-possible average communicability and the average communicability for the communication system.

13. The computer-readable storage media of claim 11, wherein the computer-executable instructions, when executed, to determine the latency sub-index for the communication system cause the one or more processors of the computer system to:
convert the undirected graph to an edge-weighted graph, weights of the edge-weighted graph being latencies;
determine, for each pair of vertices of the edge-weighted graph, a lowest-weighted-sum path;
for each lowest-weighted-sum path, remove one edge at a time and determine a length of a new lowest-weighted-sum path for the each pair of vertices;
determine, for each pair of vertices, a Dijkstra value, the Dijkstra value comprising a quotient of the new lowest-weighted-sum path minus the lowest-weighted-sum path and the lowest-weighted-sum path;
determine an average of each finite Dijkstra value; and
determine the latency sub-index, the latency sub-index comprising an exponential of negative one times the average of each finite Dijkstra value.

14. The computer-readable storage media of claim 11, wherein the computer-executable instructions, when executed, further cause the one or more processors of the computer system to:
determine a packet-loss sub-index, wherein the data transportability comprises a product of the structure sub-index, the latency sub-index, and the packet-loss sub-index.

15. The computer-readable storage media of claim 14, wherein the computer-executable instructions, when executed, to determine the packet-loss sub-index cause the one or more processors of the computer system to:
determine a packet-loss percentage associated with the communication system or other communication systems similar to the communication system; and determine the packet-loss sub-index as one minus a quotient of the packet-loss percentage and one hundred.

16. The computer-readable storage media of claim 11, wherein the model visibility comprises an index value of a capability to obtain useable data in the distribution grid.

17. The computer-readable storage media of claim 16, wherein the estimated measurements comprise unmeasured points of the potential measurements that can be estimated using the actual measurements; and
wherein the model observability comprises a capability to combine the actual measurements and the estimated measurements to determine operating parameters for the distribution grid.

18. The computer-readable storage media of claim 11, wherein the computer-executable instructions, when executed, further cause the one or more processors of the computer system to:
identify a model validity of the system model, wherein the model validity comprises an index value of an accuracy of the system model; and
determine, by multiplying the model visibility and the model observability by the model validity, a system visibility, and a system observability, respectively, of the distribution grid.

19. The computer-readable storage media of claim 18, wherein generating the sensor allocation plan for the distribution grid uses the data transportability, the model visibility, and the model observability.

20. A method for sensor allocation in a distribution grid, the method comprising:
converting a netlist to an undirected graph, the undirected graph providing a representation of one or more vertices and edges of a communication system within or connected to the distribution grid;
determining, based on the undirected graph, a structure sub-index for the communication system;
determining, based on the undirected graph, a latency sub-index for the communication system;
determining, using the structure sub-index and the latency sub-index, a data transportability of the distribution grid, the data transportability comprising a product of the structure sub-index and the latency sub-index;
receiving a system model of the distribution grid, wherein the system model provides a representation of circuits, sensors, and locations of the sensors within the distribution grid;
determining, from the system model of the distribution grid, potential measurements of the distribution grid;
identifying, based on the sensors and the locations of the sensors in the system model, actual measurements of the distribution grid, the actual measurements including at least one of a point measurement, a flow measurement, or an injection measurement;
determining, by dividing the actual measurements by the potential measurements, a measurement fraction;
determining, by multiplying the measurement fraction by the data transportability, a model visibility of the system model, wherein the model visibility comprises an index value of a capability to obtain useable data in the distribution grid;
determining, by dividing estimated measurements by the potential measurements, an estimation fraction, wherein the estimated measurements comprise unmeasured points of the potential measurements that can be estimated using the actual measurements;
determining, by multiplying the data transportability by a sum of the measurement fraction and the estimation fraction, a model observability of the system model, wherein the model observability comprises a capability to combine the actual measurements and the estimated measurements to determine operating parameters for the distribution grid; and
generating, using the model visibility and the model observability, a sensor allocation plan for the distribution grid, wherein the sensor allocation plan indicates one or more new sensors and locations of the one or more new sensors to be placed within the distribution grid.

21. The method of claim 20, the method further comprising:
determining a packet-loss sub-index, wherein the data transportability comprises a product of the structure sub-index, the latency sub-index, and the packet-loss sub-index.

22. The method of claim 21, wherein determining the packet-loss sub-index comprises:
determining a packet-loss percentage associated with the communication system or other communication systems similar to the communication system; and
determining the packet-loss sub-index as one minus a quotient of the packet-loss percentage and one hundred.

* * * * *